(12) United States Patent
Merrigan et al.

(10) Patent No.: US 6,566,951 B1
(45) Date of Patent: May 20, 2003

(54) LOW VOLTAGE VARIABLE GAIN AMPLIFIER HAVING CONSTANT COMMON MODE DC OUTPUT

(75) Inventors: Brian E. Merrigan, Urmston (GB); Asad Ali, Bradford (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/033,354

(22) Filed: Oct. 25, 2001

(51) Int. Cl.[7] ................................................. H03F 3/45
(52) U.S. Cl. ........................ 330/254; 327/359; 330/257
(58) Field of Search ................................. 330/254, 257; 327/359

(56) References Cited

U.S. PATENT DOCUMENTS

| | | | |
|---|---|---|---|
| 4,464,632 A | * 8/1984 | Yoshihisa et al. | 330/254 |
| 5,157,350 A | * 10/1992 | Rubens | 330/254 |
| 5,859,559 A | * 1/1999 | Hong et al. | 327/359 |
| 5,896,063 A | * 4/1999 | Marsh et al. | 330/254 |
| 5,901,350 A | * 5/1999 | Stoichita et al. | |
| 5,949,285 A | * 9/1999 | Ando | 330/254 |
| 5,959,491 A | * 9/1999 | Kang | 327/359 |
| 6,049,251 A | * 4/2000 | Meyer | 330/254 |
| 6,242,963 B1 | * 6/2001 | Su et al. | 327/359 |
| 6,373,337 B1 | * 4/2002 | Ganser | 330/252 |
| 6,388,502 B2 | * 5/2002 | Kaneki et al. | 327/359 |
| 6,429,721 B1 | * 8/2002 | Armitage et al. | 327/359 |
| 6,445,251 B1 | * 9/2002 | Robinson | 330/254 |

OTHER PUBLICATIONS

Phillip E. Allen, Douglas R. Holberg, "CMOS Analog Circuit Design," Saunders College Publishing/HBJ, Orlando, 1987, pp 605–607.

* cited by examiner

Primary Examiner—Michael Tokar
Assistant Examiner—Khai M. Nguyen
(74) Attorney, Agent, or Firm—Westman, Champlin & Kelly

(57) ABSTRACT

A variable gain amplifier includes a differential transconductor, a differential gain stage, a DC compensation circuit and first and second load resistors. The differential transconductor has first and second differential voltage signal inputs and first and second differential current outputs. The differential gain stage selectively steers current from the first and second differential current outputs to first and second variable current outputs, respectively, and to first and second compensation current outputs, respectively, based on a differential gain control input. The first and second load resistors are coupled to the first and second variable current outputs, respectively. The DC compensation circuit combines current in the first and second compensation current outputs to form a DC compensation current and couples the DC compensation current to the first and second load resistors.

16 Claims, 4 Drawing Sheets

US 6,566,951 B1

LOW VOLTAGE VARIABLE GAIN AMPLIFIER HAVING CONSTANT COMMON MODE DC OUTPUT

FIELD OF THE INVENTION

The present invention relates to analog integrated circuits. In particular, the present invention relates to a variable gain amplifier having a constant common mode DC output voltage.

BACKGROUND OF THE INVENTION

Variable gain amplifiers are commonly used in analog integrated circuits. For example, variable gain amplifiers are used in communication receivers, such as satellite tuners. A typical variable gain amplifier includes a differential input transconductor which converts a differential input voltage signal to a differential input current. A variable gain stage selectively varies the differential input current based on a differential gain control input signal to produce a differential current output. The differential current output is then mirrored into a pair of load resistors to produce a differential output voltage. The AC signal gain from the differential voltage input to the differential voltage output is adjusted by adjusting the current gain through the gain stage. However, as the AC signal levels in the differential output current are varied, the DC levels in these output currents also vary. This varies the DC current levels provided to the load resistors and results in the common mode DC output voltage adversely varying with gain. Therefore, additional circuitry may be required to either compensate for variances in the common mode DC output voltage or reduce their effect before the outputs of the amplifier are applied to subsequent circuit stages.

For example, the amplifier output can be AC-coupled to the next circuit stage through a pair of AC coupling capacitors. These capacitors can be implemented either on-chip or off-chip. On-chip AC coupling capacitors consume considerable semiconductor die area and are limited to fairly small sizes. Off-chip AC coupling capacitors consume input/output pins on the integrated circuit and increase design complexity. Alternatively, stacked-stages can be used with parallel replicated push or pull currents to preserve a common mode DC voltage. These circuits can also increase die area and complexity and with stacked structures can lead to reduced signal swing as the supply voltage reduces.

Improved variable gain amplifiers are therefore desired that are capable of operating at reduced supply voltages and varying gain while maintaining a substantially constant common mode DC output voltage.

SUMMARY OF THE INVENTION

One embodiment of the present invention is directed to a variable gain amplifier, which includes a differential transconductor, a differential gain stage, a DC compensation circuit and first and second load resistors. The differential transconductor has first and second differential voltage signal inputs and first and second differential current outputs. The differential gain stage selectively steers current from the first and second differential current outputs to first and second variable current outputs, respectively, and to first and second compensation current outputs, respectively, based on a differential gain control input. The first and second load resistors are coupled to the first and second variable current outputs, respectively. The DC compensation circuit combines current in the first and second compensation current outputs to form a DC compensation current and couples the DC compensation current to the first and second load resistors.

Another embodiment of the present invention is directed to a differential variable gain amplifier, which includes a differential voltage signal input, a differential gain control input, a differential voltage signal output and first and second load resistors which are coupled to respective terminals of the differential voltage signal output. A conversion circuit converts the differential voltage signal input to a differential input current. A variable gain circuit produces a variable differential output current and a DC compensation current from the differential input current based on the differential gain control input. An output circuit feeds the differential output current through the first and second load resistors. A DC compensation circuit injects the DC compensation current into the first and second load resistors.

Another embodiment of the present invention is directed to a method of varying gain from a differential voltage input signal to a differential voltage output signal based on a differential gain control signal. The method includes: converting the differential voltage input signal to a differential input current having first and second input current legs; selectively steering current away from the first and second input current legs based on the differential gain control signal to produce first and second variable output currents, respectively, and first and second compensation currents, respectively; feeding the first and second variable output currents through the first and second load resistors, respectively; and summing the first and second output currents to produce a DC compensation current and injecting the DC compensation current into the first and second load resistors.

DETAILED DESCRIPTION OF ILLUSTRATIVE EMBODIMENTS

Figure 1:
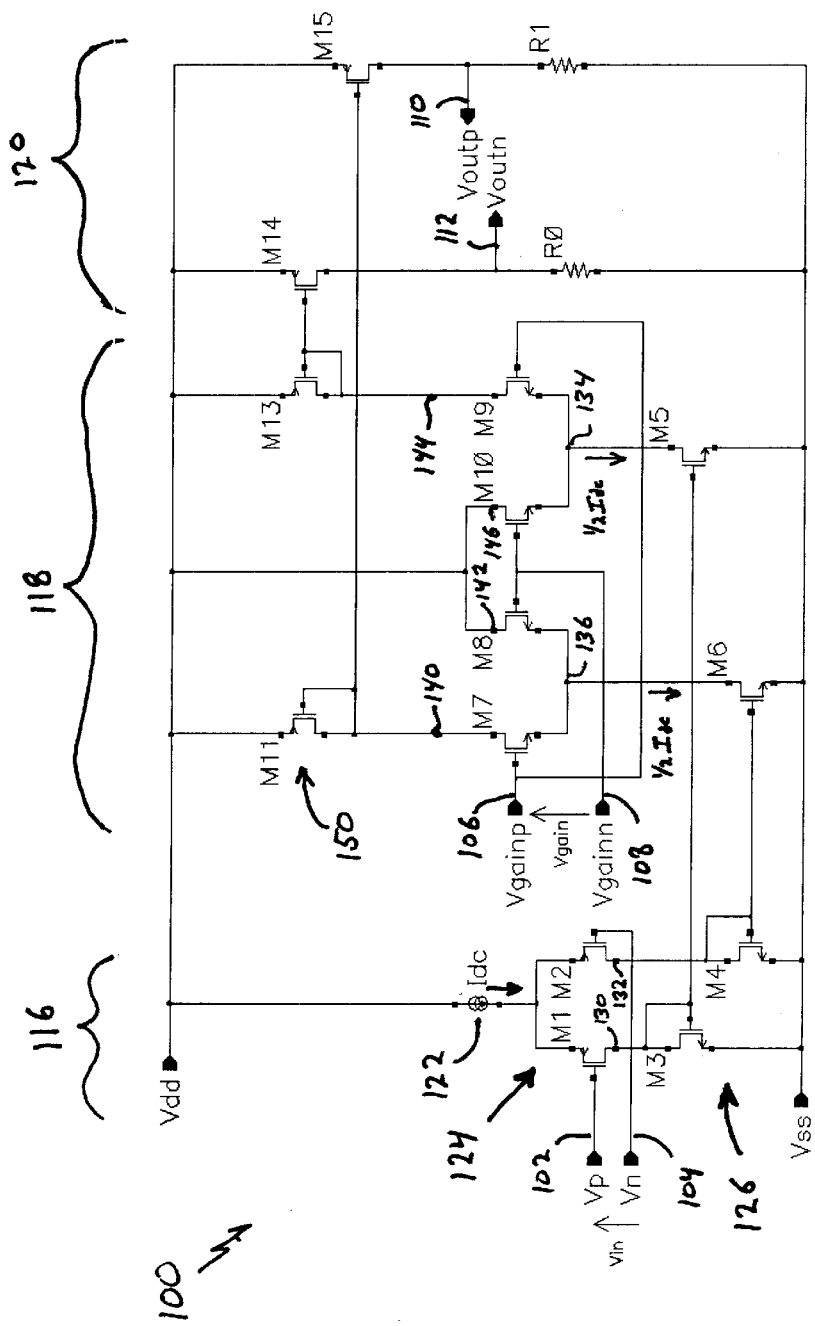
FIG. 1 is a schematic diagram of a variable gain amplifier having a variable common mode DC output voltage according to the prior art.

FIG. 1 is a schematic diagram of a variable gain amplifier 100 having a variable common mode DC output voltage according to the prior art. Amplifier 100 is electrically coupled between positive voltage supply rail VDD and negative voltage supply rail VSS. Amplifier 100 includes differential voltage signal inputs Vp and Vn (labeled 102 and 104), differential gain control inputs Vgainp and Vgainn (labeled 106 and 108), and differential voltage signal outputs Voutp and Voutn (labeled 110 and 112). Amplifier 100 further includes an input stage 116, a gain stage 118 and an output stage 120.

Amplifier input stage 116 includes a current source 122, a differential transconductor 124 and a current mirror circuit 126. Current source 122 is coupled in series between voltage supply rail VDD and transconductor 124 for supplying a DC input current, Idc, to transconductor 124. Transconductor 124 includes P-channel metal oxide semiconductor (PMOS) transistors M1 and M2, which are coupled together to form a differential transistor pair. Transistors M1 and M2 have sources coupled to current source 122, gates (or "current control terminals") coupled to differential voltage signal inputs Vp and Vn, respectively, and drains which define a pair of differential current outputs 130 and 132. Transistors M1 and M2 steer the input current Idc through outputs 130 and 132 as a function of the relative voltage levels on Vp and Vn to thereby convert the differential input voltage, Vin, into a differential input current. Transistors M1 and M2 are matched with one another.

Current mirror circuit 126 includes a first current mirror formed by NMOS reference transistor M3 and NMOS output transistor. M5 and a second current mirror formed by NMOS reference transistor M4 and NMOS output transistor M6. Reference transistor M3 is coupled to function as a diode and has a gate and drain coupled to current output node 130 and a source coupled to voltage supply rail VSS. Output transistor M5 has a gate coupled to the gate and drain of reference transistor M3, a drain coupled to a current input 134 of gain stage 118 and a source coupled to voltage supply rail VSS. Similarly, reference transistor M4 has a gate and drain coupled to current output node 132 and a source coupled to voltage supply rail VSS. Output transistor M6 has a gate coupled to the gate and drain of reference transistor M4, a drain coupled to a current input 136 of gain stage 118 and a source coupled to voltage supply terminal VSS. Transistors M3–M6 are matched with one another.

During operation, current mirror circuit 126 mirrors the differential input currents on current outputs 130 and 132 to current inputs 134 and 136 of variable gain stage 118. Current mirror output transistor M5 serves as a tail current source for current input 134, and current mirror output transistor M6 serves as a tail current source for current input 136. The tail currents supplied by output transistors M5 and M6 each have an AC signal component and a DC component. The DC component of each tail current is ½Idc.

Gain stage 118 includes a first differential transistor pair formed by NMOS transistors M7 and M8 and a second differential transistor pair formed by NMOS transistors M9 and M10. Transistors M7–M10 are matched with one another. Transistors M7 and M8 have gates coupled to gain control inputs Vgainp and Vgainn, respectively, sources coupled to current input 136 and drains which define current outputs from the differential transistor pair. The drain of transistor M7 defines a first variable current output 140 of gain stage 118, and the drain of transistor M8 defines a first unused current output 142 of gain stage 118.

Similarly, transistors M9 and M10 have gates coupled to gain control inputs Vgainp and Vgainn, respectively, sources coupled to current input 134 and drains that define current outputs of the differential transistor pair. The drain of transistor M9 defines a second variable current output 144 of gain stage 118, and the drain of transistor M10 defines a second unused current output 146 of gain stage 118. Unused current outputs 142 and 146 are each coupled to voltage supply rail VDD.

During operation, differential transistor pair M7 and M8 selectively steers the input current on current input 136 through current outputs 140 and 142 as a function of the relative voltage levels, Vgain, on gain control inputs Vgainp and Vgainn. Similarly, differential transistor pair M9 and M10 selectively steers the input current on current input 134 through current outputs 144 and 146 as a function of the relative voltage levels, Vgain, on gain control inputs Vgainp and Vgainn. When transistors M7 and M9 are fully switched on, all of the tail currents supplied by output transistors M5 and M6 at nodes 136 and 134 flow through transistors M7 and M9 such that the current at outputs 140 and 144 is equal to the tail currents at nodes 136 and 134. As transistors M8 and M10 are turned on, a portion of the tail currents supplied by output transistors M5 and M6 is directed to unused current outputs 142 and 146, respectively. The AC and DC current levels on outputs 140 and 144 therefore drop with the increase in current levels through outputs 142 and 146. The diverted currents in outputs 142 and 146 are steered into voltage supply rail VDD. Thus, the variation on current outputs 140 and 144 is a function of the gain control input signal, Vgain.

Output stage 120 transfers the differential output currents on outputs 140 and 144 to a pair of matched load resistors R0 and R1. Output stage 120 includes a current mirror circuit 150, which includes a first current mirror formed by PMOS reference transistor M11 and PMOS output transistor M15 and a second current mirror formed by PMOS reference transistors M13 and PMOS output transistor M14. Reference transistor M11 has a gate and drain coupled to variable current output 140 and a source coupled to voltage supply rail VDD. Output transistor M15 has a gate coupled to the gate and drain of reference transistor M11, a drain coupled to load resistor R1 and voltage output terminal Voutp and a source coupled to voltage supply rail VDD. Similarly, reference transistor M13 has a gate and drain coupled to variable current output 144 and a source coupled to voltage supply rail VDD. Output transistor M14 has a gate coupled to the gate and drain of reference transistor M13, a drain coupled to load resistor R0 and voltage output terminal Voutn and a source coupled to voltage supply rail VDD. Transistors M11, M13, M14 and M15 are matched with one another.

Current mirror circuit 150 mirrors the current outputs 140 and 144 from the drains of reference transistors M1 and M13 to the drains of output transistors M15 and M14, respectively, and thus into load resistors R1 and R0, respectively. Load resistors R1 and R0 convert the mirrored, differential output current into a differential output voltage, Vout, on voltage output terminals Voutp and Voutn.

A disadvantage of amplifier 100 is that the common mode DC output voltage on outputs Voutp and Voutn varies with AC signal gain. As gain stage 118 varies the AC signal gain from current inputs 134 and 136 to current outputs 140 and 144, the DC current gain is also varied. As the DC current levels in current outputs 140 and 144 change, the DC current levels supplied to load resistors R0 and R1 also change. This causes the common mode DC output voltage on voltage outputs Voutp and Voutn to vary with gain. Changes in the common mode DC output voltage make it difficult to couple amplifier 100 to subsequent circuit stages in the overall system in which the amplifier is used. Additional circuit elements are often needed to either correct the common mode DC output voltage or reduce its effects. For example, amplifier 100 can be AC-coupled to the next circuit stage through a pair of AC coupling capacitors. These capacitors can be implemented either on-chip or off-chip. On-chip AC coupling capacitors consume considerable semiconductor die area and are limited to fairly small sizes. Off-chip AC coupling capacitors consume input/output pins of the integrated circuit and increase design complexity. Alternatively, stacked-stages can be used with parallel replicated push or pull currents to preserve a common mode DC voltage. These circuits can also increase die area and complexity.

Figure 2:
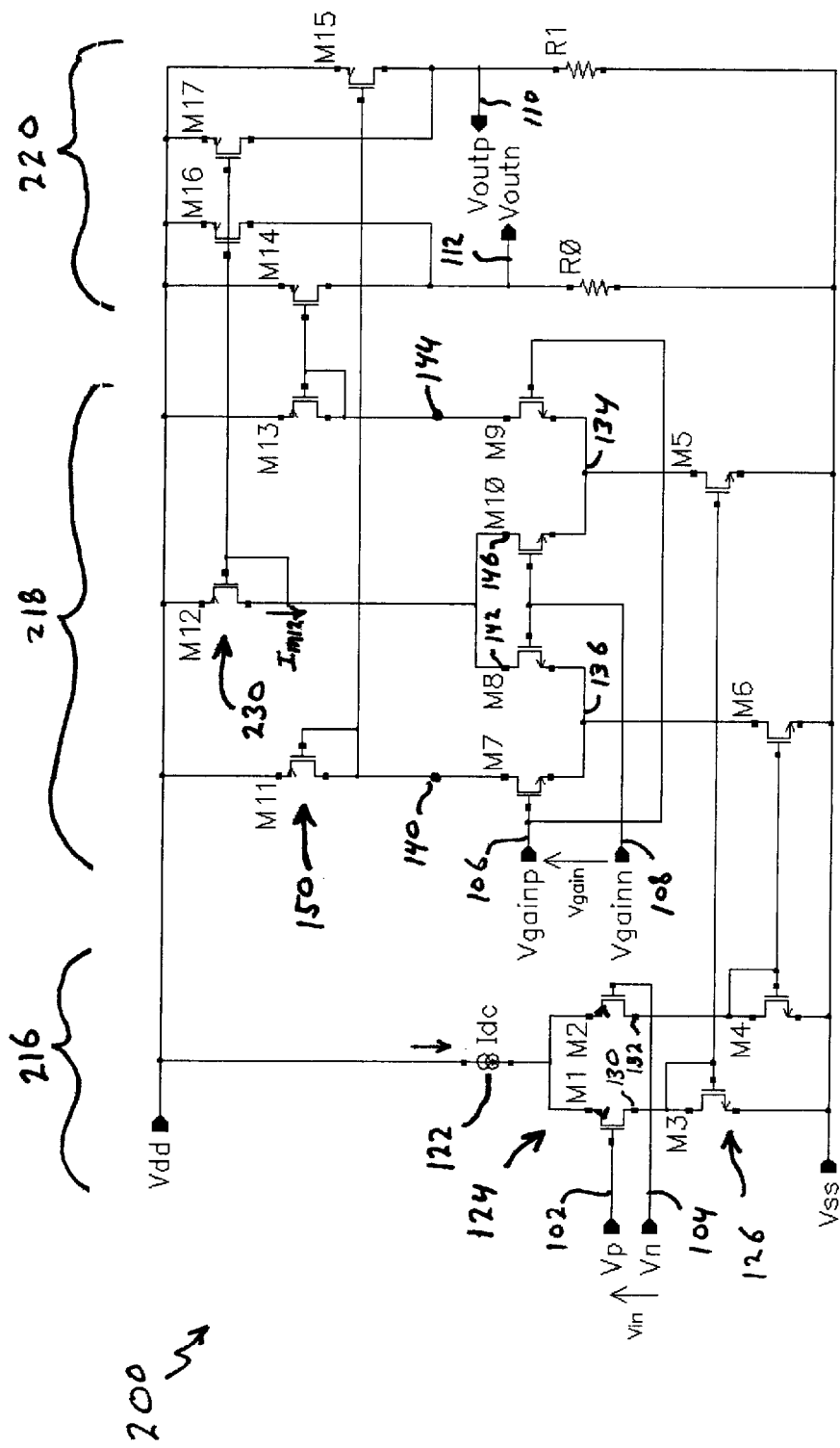
FIG. 2 is a schematic diagram illustrating a variable gain amplifier having a constant common mode DC output voltage according to one embodiment of the present invention.

FIG. 2 is a schematic diagram illustrating a variable gain amplifier 200 having a constant common mode DC output voltage according to one embodiment of the present invention. This allows amplifier 200 to be DC-coupled directly to subsequent circuit stages. Amplifier 200 has many of the same basic circuit elements as amplifier 100 shown in FIG. 1, but also has additional circuit elements for maintaining a constant common mode DC output voltage. Therefore, the same reference numerals are used in FIG. 2 as were used in FIG. 1 for the same or similar elements.

Amplifier 200 is coupled between voltage supply rails VDD and VSS and includes differential voltage signal inputs Vp and Vn (labeled 102 and 104), differential gain control input Vgainp and Vgainn (labled 106 and 108) and differential voltage signal outputs Voutp and Voutn (labeled 110 and 112). Amplifier 200 further includes input stage 216, gain stage 218 and output stage 210. Similar to amplifier 100, input stage 216 includes current source 122 and differential input transconductor 124 and current mirror circuit 126. Differential input transconductor 124 is formed by differential NMOS transistors pair M1 and M2. Current mirror circuit includes NMOS reference transistors M3 and M4 and NMOS output transistors M5 and M6. Output transistors M5 and M6 serve as tail current sources for current inputs 134 and 136 of gain stage 218.

Gain stage 218 includes NMOS differential transistor pair M7 and M8 and NMOS differential transistor pair M9 and M10, which are coupled in a similar fashion as transistors M7–M10 in FIG. 1. However, current outputs 142 and 146 are no longer coupled directly to voltage supply rail VDD. Rather, current outputs 142 and 146 are coupled to a DC compensation circuit 230, which compensates the DC output currents fed to load resistors R0 and R1 to maintain a substantially constant common mode DC output voltage. Current outputs 142 and 146 therefore serve as current compensation outputs rather than unused current outputs as in FIG. 1.

Similar to output stage 120, output stage 220 includes a current mirror circuit 150 formed by PMOS reference transistors M13 and M14, and PMOS output transistors M14 and M15. Reference transistors M11 and M13 mirror the output currents on outputs 140 and 144 onto the drains of output transistors M15 and M14, respectively, and thus into load resistors R1 and R0, respectively. Unlike output stage 120, output stage 220 further includes the DC current compensation circuit 230. DC current compensation circuit 230 includes PMOS reference transistor M12 and PMOS output transistors M16 and M17 which are coupled together to form a current mirror. Reference transistor M12 is coupled as a diode in series between voltage supply rail VDD and current compensation outputs 142 and 146, with the gate and drain of transistor M12 being coupled to outputs 142 and 146 and the source of transistor M12 being coupled to voltage supply rail VDD. Output transistors M16 and M17 are coupled in series with load resistors R0 and R1, respectively. Output transistor M16 has a gate coupled to the gate and drain of reference transistor M12, a drain coupled to load resistor R0 and a source coupled to voltage supply rail VDD. Output transistor M17 has a gate coupled to the gate and drain of reference transistor M12, a drain coupled to load resistor R1 and a source coupled to voltage supply rail VDD.

During operation, reference transistor M12 is used as a load for the currents on current compensation outputs 142 and 146. The currents on outputs 142 and 146 are summed together and fed to the drain of reference transistor M12. The AC signal components of the currents on outputs 142 and 146 are of the same magnitude but are of opposite phase (or anti-phase) with one another. Therefore these AC signal components cancel each other out completely. The overall AC signal component supplied to the drain of reference transistor M12 is therefore zero, and the remaining current is completely DC. This DC current component is then mirrored into load resistors R0 and R1 as DC compensation currents to compensate for changes in the DC current levels supplied by output transistors M14 and M15 with changes in gain.

In one embodiment, the sizes of output transistors M16 and M17 are one-half the size of reference transistor M12. For MOS devices, the gate areas of output transistors M16 and M17 are one-half the gate area of reference transistor M12. Therefore, half of the DC compensation current is fed to load resistor R0 and the other half is fed to load resistor R1. Since the same DC currents that were unused from current outputs 142 and 146 are fed back in to load resistors R0 and R1, the common mode DC output voltage developed by these load resistors remains substantially constant with changes in gain.

Looking at the various current levels in amplifier 200, the input DC current supplied by current source 122 is Idc. The sum of the currents in reference transistors M3 and M4 is therefore also Idc, as is the sum of the currents in output transistors M5 and M6. It follows that the sum of the currents in transistors M7–M10 is also Idc, irrespective of the voltage levels on Vgainp and Vgainn. The sum of the currents in reference transistors M11 and M13 is therefore Idc minus Im12, where Im12 is the current in reference transistor M12. The sum of the output currents in output transistors M14 and M15 will also be Idc minus Im12. If the current Im12 in reference transistor M12 is mirrored into output transistors M16 and M17 and both M16 and M17 are one-half the size of M12, then the sum of the output currents in M16 and M17 is Im12. If the drains of output transistors M16 and M17 are coupled to the top ends of load resistors R0 and R1, as shown in FIG. 2, then the resulting sum of the currents supplied to load resistors R0 and R1 by all of the output transistors M14–M17 is Idc. The common mode voltage across load resistors R0 and R1 is therefore always constant and equal to R×½Idc, where R is the resistance of each of the load resistors R0 and R1.

Figure 3:
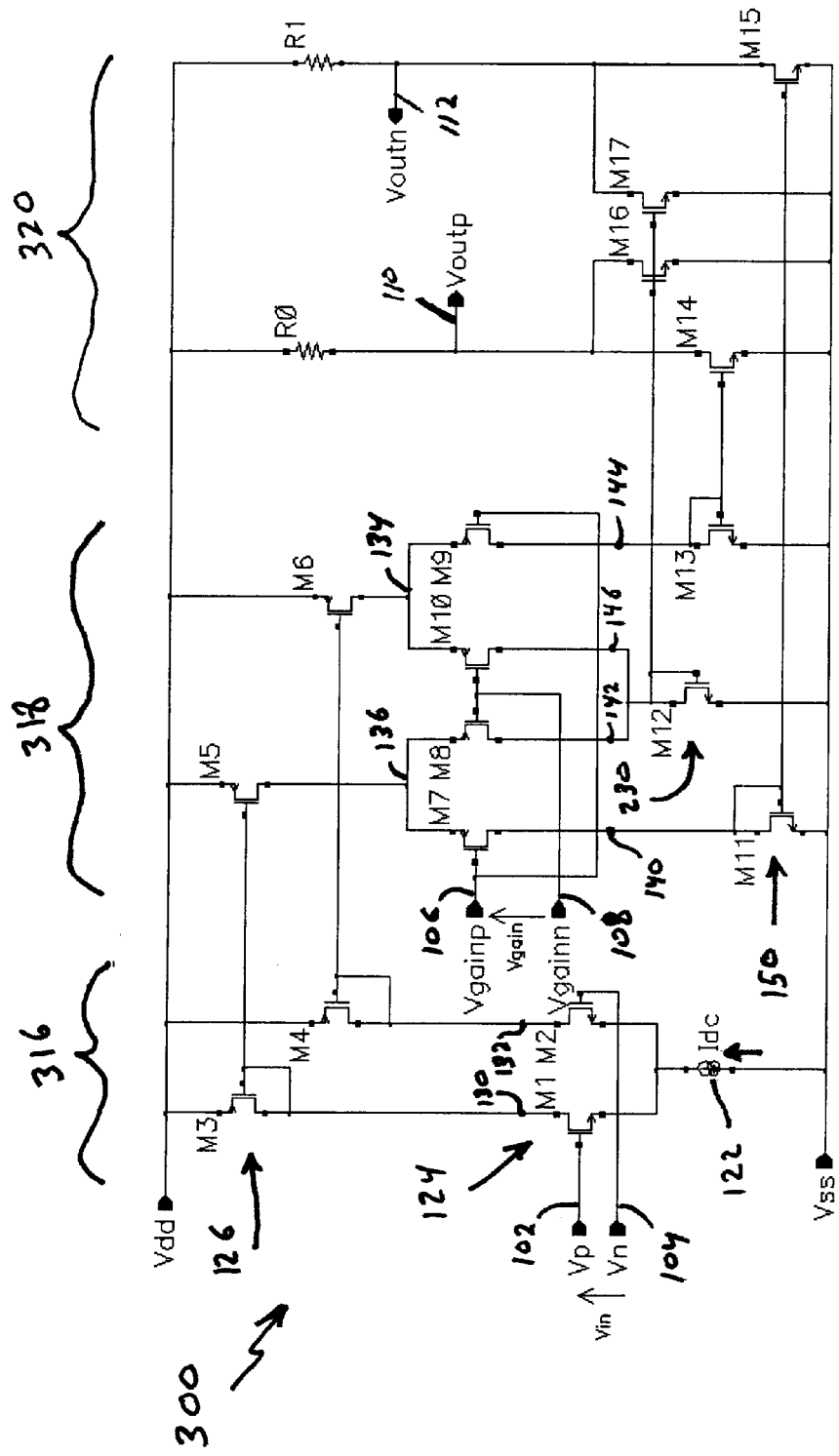
FIG. 3 is a schematic diagram illustrating a variable gain amplifier having a constant common mode DC output voltage according to an alternative embodiment of the present invention.

Numerous modifications to the circuit shown in FIG. 2 are possible. For example, the entire amplifier circuit can be inverted as shown in FIG. 3. The same reference numerals are used in FIG. 3 as were used in FIG. 2 for the same or similar elements. Amplifier 300 includes an input stage 316, a variable gain stage 318 and an output stage 320, which are together formed by MOS transistors M1–M17 similar to MOS transistors M1–M17 of amplifier 200 in FIG. 2. However the PMOS devices M1, M2 and M11–M17 in amplifier 200 are replaced with NMOS devices M1, M2 and M11–M17 in amplifier 300. Similarly, NMOS devices M3–M10 in amplifier 200 are replaced with PMOS devices M3–M10 in amplifier 300. Current source 122 is now VSS-referred and is coupled between the sources of transistors M1 and M2 and voltage supply rail VSS. Current mirror circuit 126 is coupled to voltage supply rail VDD and current mirror circuits 150 and 230 are coupled to voltage supply rail VSS. Load resistors R0 and R1 are coupled between voltage supply rail VDD and differential outputs Voutp and Voutn. Although the circuit elements in amplifier 300 are inverted relative to similar circuit elements in amplifier 200, amplifier 300 operates in the similar fashion as amplifier 200.

Other circuit modifications can also be made. For example, each of the transistors shown in FIGS. 2 and 3 can include a single transistor or an array of transistors connected together in parallel. Each of the current mirrors 126 and 150 can have any suitable gain, as opposed to unity gain, if desired. Also, the amplifier can be implemented in other semiconductor technologies in addition to MOS or CMOS, such as bi-polar and bi-CMOS technologies. The input and gain stages shown in FIGS. 2 and 3 are simply examples of input and gain stages that can be used with the present invention. Other types of input and gain stages can also be used.

Even further, one or more of the current mirrors in the amplifier can be removed with appropriate circuit inversions. For example, current mirror circuit 126 can be removed, with input stage 216 and gain stage 218 being coupled together in series between supply rails VDD and VSS. In this embodiment, either input stage 216 or gain stage 218 would be logically inverted such that input stage 216 would supply the differential input current directly to current inputs 134 and 136 of gain stage 218.

Figure 4:
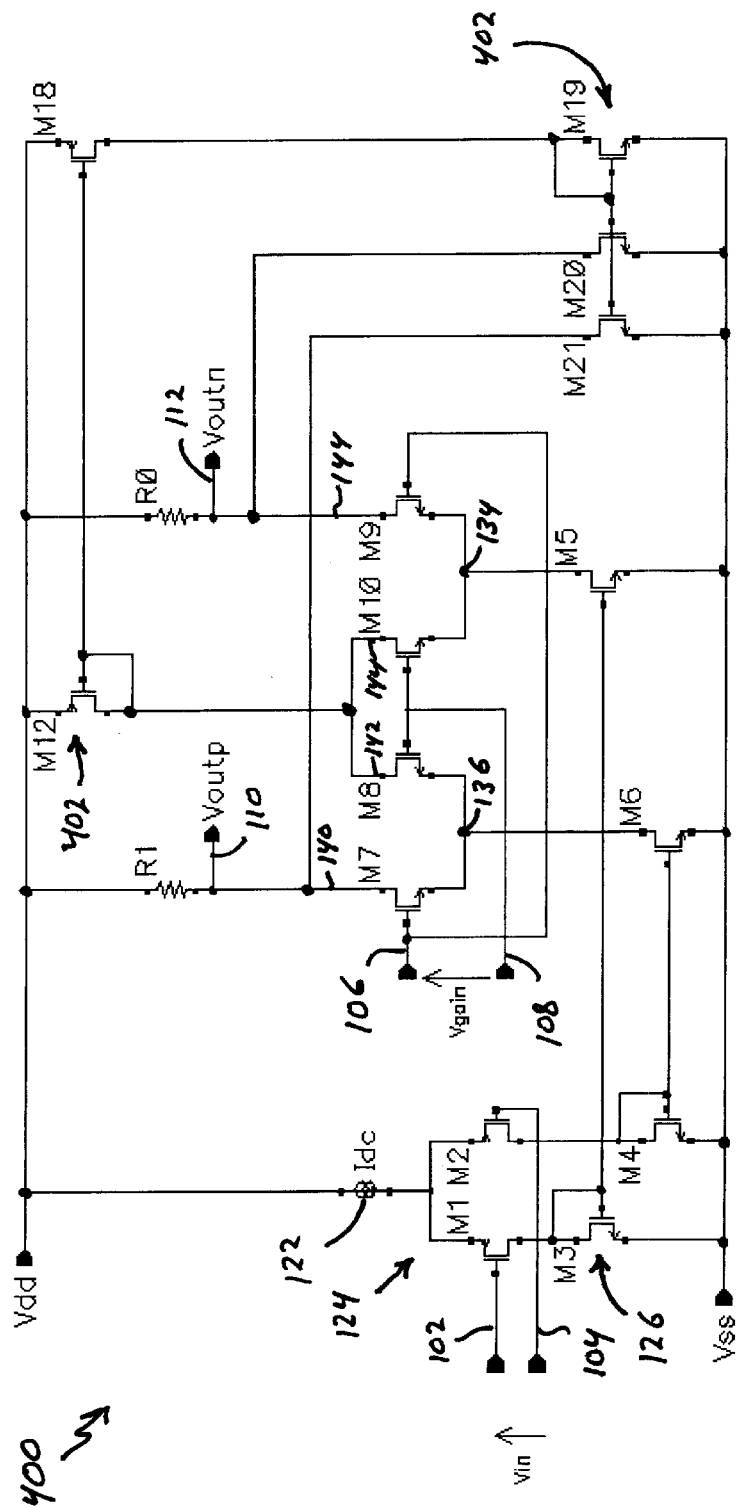
FIG. 4 is a schematic diagram illustrating a variable gain amplifier having a constant common mode DC output voltage according to another alternative embodiment of the present invention.

Similarly, current mirror circuit 150 can be eliminated, with load resistors R0 and R1 being coupled in series with the gain stage between voltage supply rails VDD and VSS, as shown in FIG. 4. Again, the same reference numerals are used in FIG. 4 as were used in the previous figures for the same or similar elements. In amplifier 400, load resistors R0 and R1 are coupled in series between voltage supply rail VDD and the drains of transistors M9 and M7, respectively. The compensation currents in outputs 142 and 146 are combined as in the previous embodiments and then added back into the current delivered to load resistors R0 and R1 through a current mirror circuit 402.

Current mirror circuit 402 includes a first current mirror formed by PMOS reference transistor M12 and PMOS output transistor M18 and a second current mirror formed by NMOS reference transistor M19 and NMOS output transistors M20 and M21. Reference transistor M12 is coupled as a diode in series between voltage supply rail VDD and current outputs 142 and 146, with the gate and drain of transistor M12 being coupled to outputs 142 and 146 and the source of transistor M12 being coupled to voltage supply rail VDD. Output transistor M18 has a gate coupled to the gate and drain of reference transistor M12, a drain coupled to the gate and drain of reference transistor M19 and a source coupled to voltage supply rail VDD. Reference transistor M19 has a source coupled to voltage supply rail VSS. Output transistors M20 and M21 are coupled in series with load resistors R0 and R1, respectively. Output transistor M20 has a gate coupled to the gate and drain of reference transistor M19, a drain coupled to load resistor R0 and a source coupled to voltage supply rail VSS. Output transistor M21 has a gate coupled to the gate and drain of reference transistor M19, a drain coupled to load resistor R1 and a source coupled to voltage supply rail VSS.

In this embodiment, the combined compensation current in reference transistor M12 is mirrored onto the drain of output transistor M18 and then passed to reference transistor M19. The current passed to reference transistor M19 is mirrored onto the drains of output transistors M20 and M21. Output transistors M20 and M21 have ½ the area of reference transistor M19. The currents mirrored onto the drains of output transistors M20 and M21 are then passed to load resistors R0 and R1, respectively, as DC compensation currents.

Additional modifications can also be made. Non-idealities in the circuit can cause common mode currents and voltages at outputs Voutp and Voutn to vary. Feedback loops can be added to the amplifier to sense these variances and inject correction currents to correct for offsets and make the common mode levels more accurate. Also, similar feedback techniques can be used to inject parallel DC currents that can force the output Voutp and Voutn to sit at a common mode voltage which is unrelated to R×Idc/2.

Although the present invention has been described with reference to preferred embodiments, workers skilled in the art will recognize that changes may be made in form and detail without departing from the spirit and scope of the invention. The term "current source" used in the specification and the claims is intended to include both a current source and a current sink. Similarly, the term "transistor" can include a single transistor or an array of transistors coupled together in parallel. The term "coupled" can include a direct connection or a connection through one or more intermediate components.

What is claimed is:

1. A variable gain amplifier comprising:
    a differential transconductor having first and second differential voltage signal inputs and first and second differential current outputs;
    a differential gain stage which selectively steers current from the first and second differential current outputs to first and second variable current outputs, respectively, and to first and second compensation current outputs, respectively, based on a differential gain control input;
    first and second load resistors coupled to the first and second variable current outputs, respectively; and
    a DC compensation circuit which combines current in the first and second compensation current outputs to form a DC compensation current and couples the DC compensation current to the first and second load resistors.

2. The variable gain amplifier of claim 1 wherein the first and second compensation current outputs are coupled together and the DC compensation circuit comprises:
    a DC compensation current mirror comprising a reference transistor coupled in series with the first and second compensation current outputs and first and second output transistors coupled in series with the first and second load resistors, respectively.

3. The variable gain amplifier of claim 2 wherein:
    the reference transistor has a current control terminal with an area; and
    the first and second output transistors have current control terminals with areas that are half of the area of the current control terminal of the reference transistor.

4. The variable gain amplifier of claim 1 wherein the differential gain stage comprises:
    a first differential transistor pair having first and second current-steering control terminals coupled to first and second gain control terminals, respectively, of the differential gain control input, a common node coupled to receive current from the first differential current output, and first and second current output legs;
    a second differential transistor pair having third and fourth current-steering control terminals cross-coupled to second and first gain control terminals, respectively, a common node coupled to receive current from the second differential current output, and third and fourth current output legs;
    wherein the first and fourth current output legs are coupled to the first and second variable current outputs, respectively; and wherein the second and third current output legs are coupled to the first and second compensation current outputs, respectively.

5. The variable gain amplifier of claim 4 and further comprising:
   a first output current folding mirror comprising a first reference transistor coupled in series with the first variable current output of the gain stage and a first output transistor coupled in series with the first load resistor; and
   a second output current folding mirror comprising a second reference transistor coupled in series with the second variable current output of the gain stage and a second output transistor coupled in series with the second load resistor.

6. The variable gain amplifier of claim 1 wherein the differential transconductor comprises:
   an input current source; and
   a differential transistor pair having first and second current-steering control terminals coupled to first and second terminals, respectively, of the differential voltage signal input, a common node coupled to the input current source, and first and second current output legs coupled to the first and second differential current outputs, respectively.

7. The variable gain amplifier of claim 6 and further comprising:
   a first input current folding mirror comprising a first reference transistor coupled in series with the first differential current output and a first output transistor coupled in series with a first current input to the differential gain stage; and
   a second input current folding mirror comprising a second reference transistor coupled in series with the second differential current output and a second output transistor coupled in series with a second current input to the differential gain stage.

8. A differential variable gain amplifier comprising:
   a differential voltage signal input;
   a differential gain control input;
   a differential voltage signal output;
   first and second load resistors which are coupled to respective terminals of the differential voltage signal output;
   conversion means for converting the differential voltage signal input to a differential input current;
   variable gain means for producing a differential output current and a DC compensation current from the differential input current based on the differential gain control input;
   output means for feeding the differential output current through the first and second load resistors; and
   DC compensation means for injecting the DC compensation current into the first and second load resistors.

9. The differential variable gain amplifier of claim 8 wherein the DC compensation means comprises:
   a current mirror comprising a reference transistor and first and second output transistors, wherein the reference transistor is coupled to receive the DC compensation current from the gain stage means and mirror the DC compensation current into the first and second output transistors, and wherein the first and second output transistors are coupled in series with the first and second load resistors, respectively.

10. The differential variable gain amplifier of claim 9 wherein:
    the reference transistor has a current control terminal with an area; and
    the first and second output transistors have current control terminals with areas that are half of the area of current control terminal of the reference transistor.

11. The differential variable gain amplifier of claim 8 wherein the variable gain means comprises:
    a first differential transistor pair having first and second current-steering control terminals coupled to first and second gain control terminals, respectively, of the differential gain control input, a common node coupled to receive current from a first end of the differential input current, and first and second current outputs;
    a second differential transistor pair having third and fourth current-steering control terminals cross-coupled to second and first gain control terminals, respectively, a common node coupled to receive current from a second end of the differential input current, and third and fourth current outputs;
    wherein the first and fourth current outputs are coupled to the first and second load resistors, respectively, and supply the differential output current; and
    wherein the second and third current output legs are coupled together to form an variable current output which supplies the DC compensation current.

12. The differential variable gain amplifier of claim 11 and further comprising:
    a first output current folding mirror coupled between the first current output and the first load resistor and comprising a first reference transistor coupled in series with the first current output and a first output transistor coupled in series with the first load resistor; and
    a second output current folding mirror coupled between the fourth current output and the second load resistor and comprising a second reference transistor coupled in series with the fourth current output and a second output transistor coupled in series with the second load resistor.

13. The differential variable gain amplifier of claim 8 wherein the conversion means comprises:
    an input current source; and
    a differential transistor pair having first and second current-steering control terminals coupled to first and second terminals, respectively, of the differential voltage signal input, a common node coupled to the input current source, and first and second current outputs which together supply the differential current input.

14. The differential variable gain amplifier of claim 13 and further comprising:
    a first input current folding mirror comprising a first reference transistor coupled in series with the first current output and a first output transistor coupled in series with a first current input to the variable gain means; and
    a second input current folding mirror comprising a second reference transistor coupled in series with the second current output and a second output transistor coupled in series with a second current input to the variable gain means.

15. A method of varying gain from a differential voltage input signal to a differential voltage output signal based on a differential gain control signal, the method comprising:

converting the differential voltage input signal to a differential input current having first and second input current legs;

selectively steering current away from the first and second input current legs based on the differential gain control signal to produce first and second variable output currents, respectively, and first and second compensation currents, respectively;

feeding the first and second variable output currents through the first and second load resistors, respectively; and summing the first and second output currents to produce a DC compensation current and injecting the DC compensation current into the first and second load resistors.

16. The method of claim 15 wherein the step of summing the DC compensation current comprises reducing a current level of the DC compensation current by one-half before injecting the DC compensation current into the first and second load resistors.

* * * * *